(12) United States Patent
Sze et al.

(10) Patent No.: US 8,749,249 B2
(45) Date of Patent: Jun. 10, 2014

(54) TEST HANDLER FOR ELECTRONIC DEVICES

(75) Inventors: Chak Tong Albert Sze, Hong Kong (CN); Pei Wei Tsai, Hong Kong (CN); Wa Sing Tsang, Hong Kong (CN)

(73) Assignee: ASM Assembly Automation Ltd, Hong Kong (HK)

( * ) Notice: Subject to any disclaimer, the term of this patent is extended or adjusted under 35 U.S.C. 154(b) by 598 days.

(21) Appl. No.: 12/578,785

(22) Filed: Oct. 14, 2009

(65) Prior Publication Data
US 2010/0097075 A1   Apr. 22, 2010

Related U.S. Application Data

(60) Provisional application No. 61/106,227, filed on Oct. 17, 2008.

(51) Int. Cl.
*H01H 31/02* (2006.01)

(52) U.S. Cl.
USPC .................................. 324/555; 324/762.01

(58) Field of Classification Search
USPC ............................................. 324/555
See application file for complete search history.

(56) References Cited

U.S. PATENT DOCUMENTS

| 5,422,554 | A | * | 6/1995 | Rohde | 318/568.21 |
| 5,462,446 | A | * | 10/1995 | Ikeya | 439/264 |
| 7,458,761 | B2 | * | 12/2008 | Sze et al. | 414/764 |

* cited by examiner

*Primary Examiner* — Thomas F Valone
(74) *Attorney, Agent, or Firm* — Ostrolenk Faber LLP

(57) ABSTRACT

A test handler comprises a package support for holding an electronic device in a certain orientation and for transporting the electronic device to a testing station for testing the electronic device. An orientation correction device is actuable and operative to engage the package support and to rotate the package support so as to change the orientation of the electronic device.

16 Claims, 4 Drawing Sheets

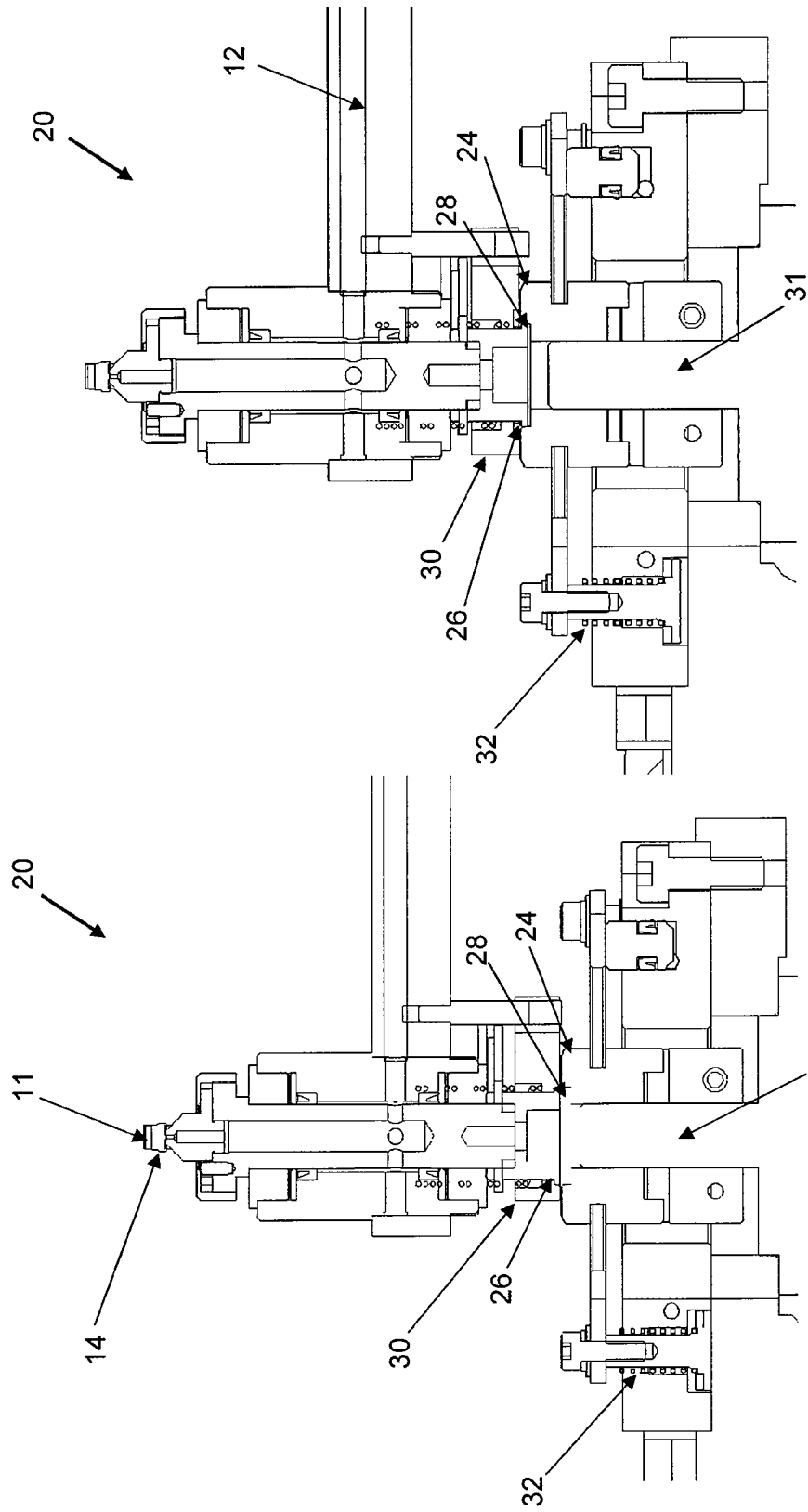

TEST HANDLER FOR ELECTRONIC DEVICES

CROSS REFERENCE TO RELATED APPLICATION

This application claims the benefit and priority of U.S. Provisional Application Ser. No. 61/106,227 filed on Oct. 17, 2008, and entitled TEST HANDLER FOR ELECTRONIC DEVICES, the disclosure of which is incorporated herein by reference.

FIELD OF THE INVENTION

The invention relates to a test handler for testing electronic devices, and in particular to an orientation correction unit comprised in the test handler for correcting the orientation of the electronic devices.

BACKGROUND AND PRIOR ART

Test handlers are used in the semiconductor industry for testing electronic devices, such as light-emitting electronic or photonics devices, in the form of light-emitting diodes ("LEDs"), integrated circuits and semiconductor chips. It is necessary to position the electronic devices in a desired orientation before subjecting the electronic devices to testing by a tester.

In some automatic test handlers which receive electronic devices such as LEDs from a bowl feeder for testing, the orientations of the LEDs are determined using a sensor at a linear track portion of the bowl feeder as they are being conveyed from the bowl feeder to a turret handler. The LEDs that are found to have the correct orientation are indexed to the next station of the turret handler. Those found not to have the correct orientation are rejected and returned to the bowl feeder. Statistically, about half of the LEDs will be rejected at the linear track since there is almost an equal chance of an LED being correctly or incorrectly oriented, thus reducing the feed rate of the LEDs to an equivalent extent.

Another common method of correctly orienting LEDs involves checking the electrical polarity of the LEDs. A bowl feeder will feed the LEDs to a turret pick arm. The LEDs are then pressed down at a test station where the electrical polarities of the LEDs are checked for their orientation. After checking the orientations of the LEDs, the turret pick arm will move up and index to an orientation correction station where the LEDs are pressed down onto the orientation correction station for polarity correction if necessary. Thereafter, the LEDs are again picked up and held by the turret pick arm, indexed and placed at a turret table to undergo optical and/or electrical testing. This method of sorting and correcting the orientation of the LEDs involves a number of pick-and-place steps. Furthermore, checking the electrical polarity is not useful for some electronic devices, such as dual dice LEDs, where the electrical polarity of the LED is similar irrespective of its orientation.

SUMMARY OF THE INVENTION

It is thus an object of the present invention to seek to provide a test handler having an orientation correction unit which detects and corrects the orientation of electronic devices quickly and efficiently by minimizing any disruption to the throughput of the test handler.

According to a first aspect of the invention, there is provided a test handler comprising: a package support for holding an electronic device in a certain orientation and for transporting the electronic device to a testing station for testing the electronic device; and an orientation correction device which is actuable and operative to engage the package support and to rotate the package support so as to change the orientation of the electronic device.

According to a second aspect of the invention, there is provided a method of testing an electronic device, comprising the steps of: holding the electronic device in a certain orientation on a package support and transporting the electronic device with the package support towards a testing station; engaging the package support with an orientation correction device and rotating the package support with the orientation correction device so as to change the orientation of the electronic device; and thereafter testing the electronic device at the testing station.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiment of the invention when considered with the accompanying drawings, in which:

FIGS. 3A and 3B are side views of the orientation correction module of FIG. 1 respectively illustrating a movable insert positioned away from a package support and the movable insert engaging the package support;

DETAILED DESCRIPTION OF THE PREFERRED EMBODIMENT OF THE INVENTION

Figure 1:
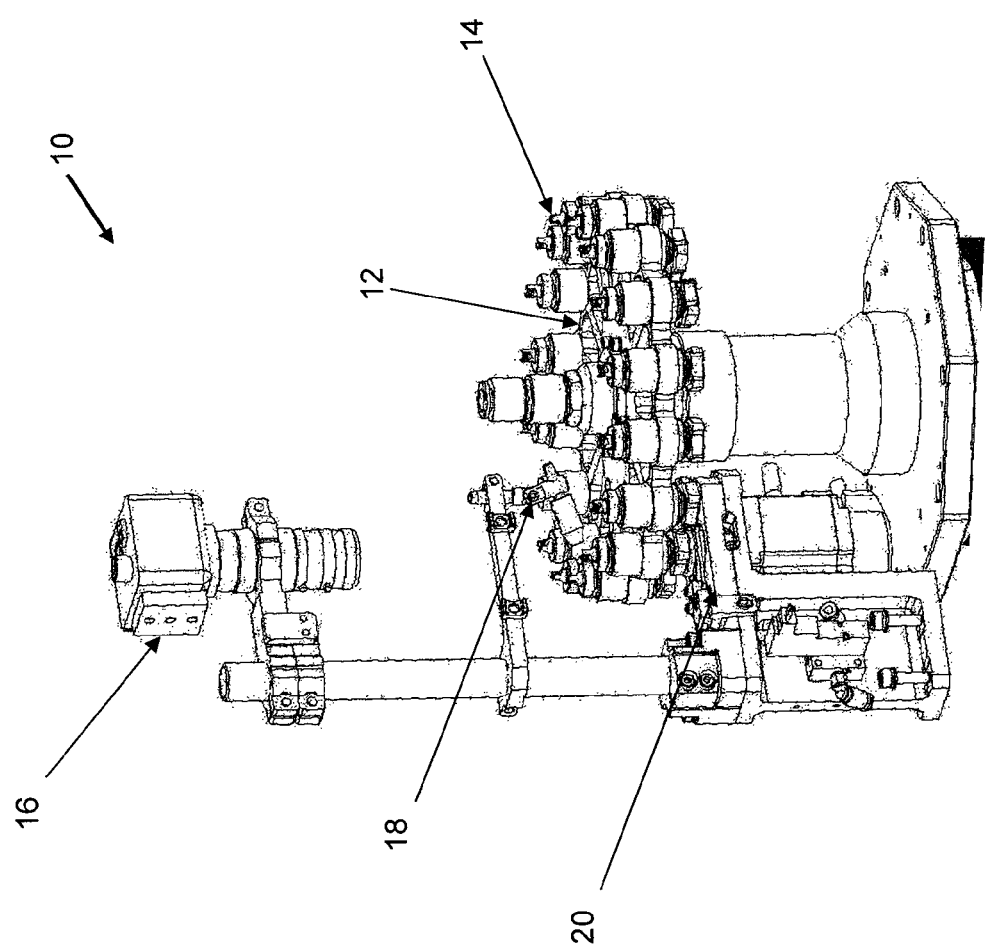
FIG. 1 is an isometric view of a test handler incorporating an orientation correction module according to the preferred embodiment of the invention.

FIG. 1 is an isometric view of a test handler 10 incorporating an orientation correction device or module 20 according to the preferred embodiment of the invention. A conveyance mechanism, which may be in the form of a rotary turret table 12, comprises multiple rotary package supports 14 which are mounted on the turret table 12 for holding and transporting multiple electronic devices. There are sixteen package supports 14 mounted on the turret table 12 in the illustrated embodiment. Each package support 14 has an electronic device such as an LED 11 mounted thereon, and transports the LED 11 to a testing station for testing the LED 11. The package support 14 can be easily detached from the turret table 12 such that package supports 14 of various dimensions are readily interchangeable for supporting LEDs 11 of different types and sizes.

The orientation correction module 20 is positioned adjacent to the rotary turret table 12 at a position along a traveling path on which the multiple package supports 14 move. It is actuable to contact and engage the rotary package support 14 when the package support 14 is moved to the position of the orientation correction module 20. By moving the orientation correction module 20 along a vertical axis to engage the package support 14, and then rotating the package support 14 about the vertical axis, an orientation of the LED 11 can be changed if necessary so that it is ready for testing.

An optical inspection device 16 and a lighting device 18 are located above the orientation correction module 20 and are configured for visually inspecting the orientation of an LED 11 which is held on a package support 14 at the position of the orientation correction module 20. Therefore, visual inspection of the LED 11 and orientation correction are conducted at the orientation correction module 20 station. This increases the efficiency of orienting the LEDs since the station is along the traveling path of the rotary package supports 14.

Figure 2:
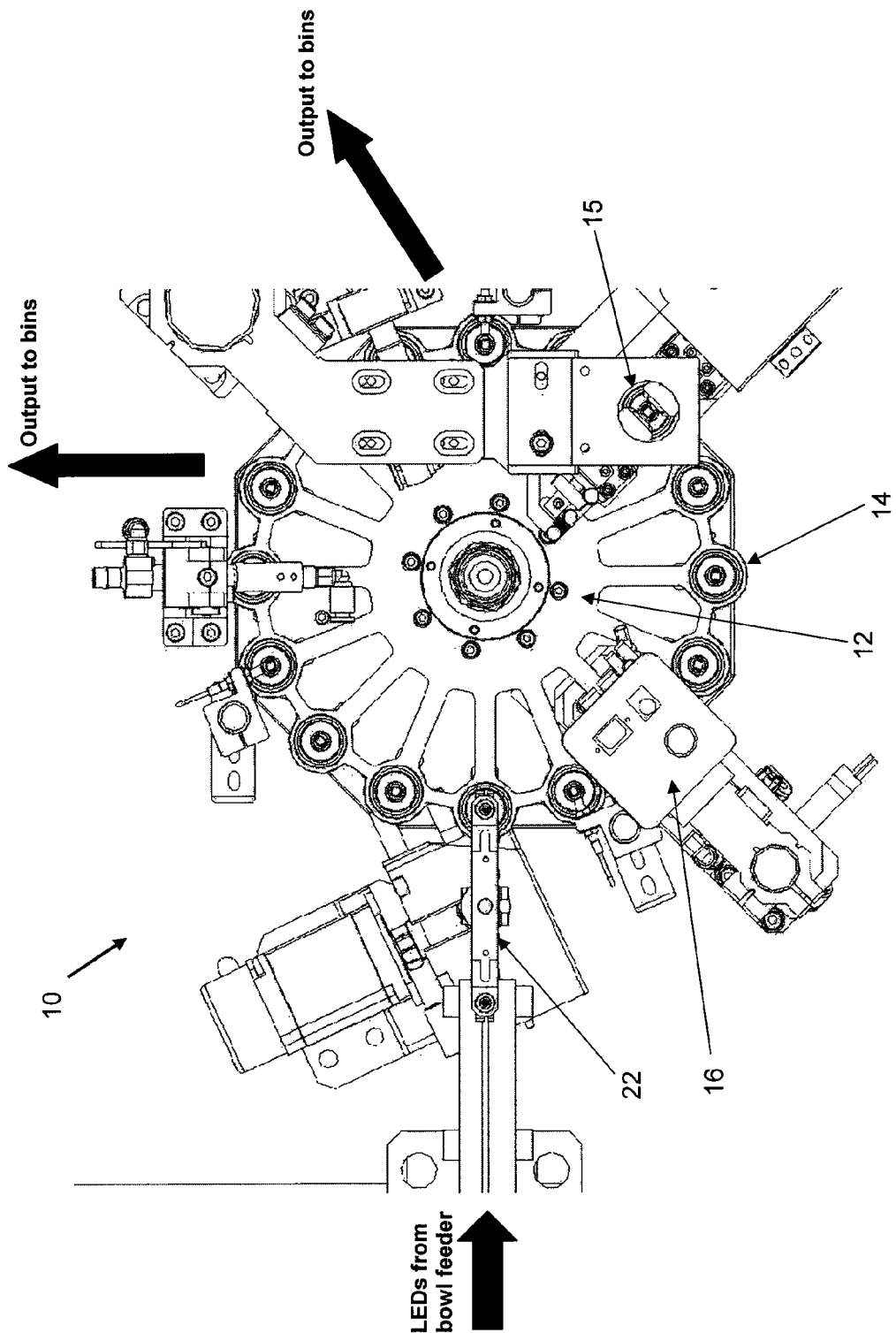
FIG. 2 is a plan view of the test handler of FIG. 1.

FIG. 2 is a plan view of the test handler 10 of FIG. 1. LEDs 11 are fed from a bowl feeder (not shown) to a linear track. A rotary input arm 22 picks each LED 11 from the linear track and places it onto an empty package support 14 on the rotary turret table 12. The package support 14 is indexed and transports the LED 11 held on it to the orientation correction module 20 located below the optical inspection device 16. At the orientation correction module 20, the orientation of the LED 11 is inspected by the optical inspection device 16 against a fiducial marking on the LED 11. Correction of the orientation of the LED 11 will be carried out when necessary. The correctly oriented LED 11 is indexed to the next station downstream of the orientation correction module 20, such as an optical and electrical test station 15, for testing. After optical and/or electrical testing has been conducted, the package supports 14 release the LEDs 11 into respective output bins at one or more output stations according to the test results. The package supports 14 are then indexed back to the pick-and-place unit to receive more LEDs 11.

FIGS. 3A and 3B are side views of the orientation correction module 20 of FIG. 1 respectively illustrating a movable flange such as a movable insert 24 positioned away from a package support 14 and the movable insert 24 engaging the package support 14. The package support 14 has a protrusion at its bottom surface adjacent to the movable insert 24 which functions as a key 26. The key 26 is operatively coupled to the LED 11 for rotation together with the LED 11, and is slidable when engaged by a complementary slot 28 on the movable insert 24. A locking mechanism in the form of a lock nut 30 connected to the key 26 fixes the orientation of the package support 14 on the rotary turret table 12, and the lock nut 30 is slidable vertically to move between a first position where it locks the orientation of the package support 14, and a second position where the package support 14 is unlocked to allow the package support 14 to rotate.

In FIG. 3A, the lock nut 30 locks and fixes the package support 14 when the slot 28 of the movable insert 24 is disengaged from the key 26. If the orientation of the LED 11 is incorrect, a motor such as a pneumatic cylinder 32 pushes the movable insert 24 linearly upwards so that the slot 28 engages the key 26 as shown in FIG. 3B. As the movable insert 24 is pushed upwards, it shoves the lock nut 30 upwards at the same time. This unlocks the package support 14 so that the package support 14 is free to rotate about a vertical axis when it is driven by a motor shaft 31. The motor shaft 31 turns the movable insert 24 which turns the key 26 of the package support 14 so that the LED 11 on the package support 14 is rotated to the correct orientation. After the orientation of the LED 11 is corrected, the pneumatic cylinder 32 lowers the movable insert 24. The lock nut 30 slides downwards accordingly and locks the package support 14 in position. Next, the turret table indexes the LED 11 to the testing station 15 for testing.

Figure 4:
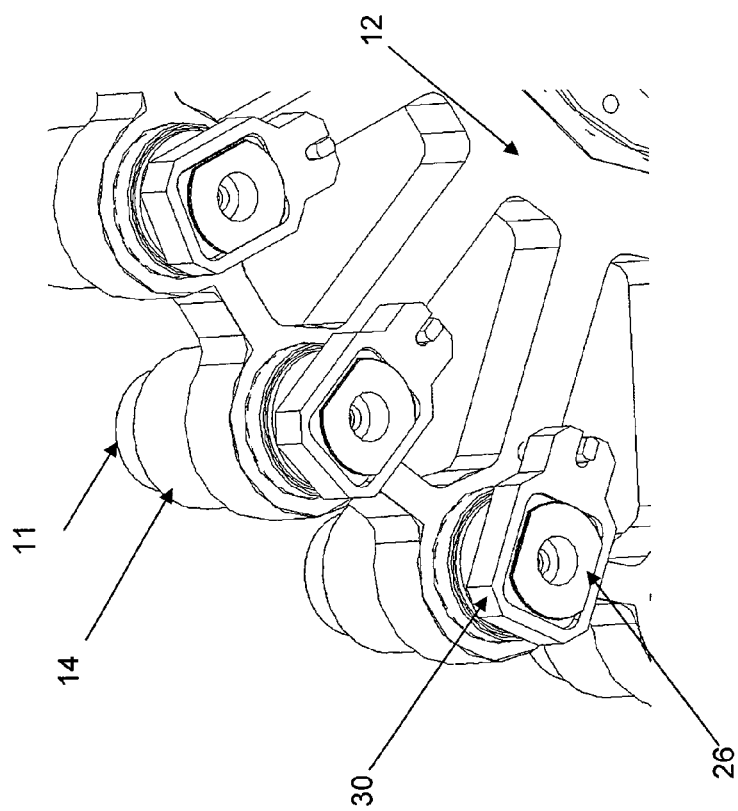
FIG. 4 is an isometric view of package supports comprised in a rotary turret table.

FIG. 4 is an isometric view of the underside of the package supports 14 comprised in the rotary turret table 12. LEDs 11 are mounted on the package supports 14 which are mounted on the rotary turret table 12. The lock nut 30 engages and holds the package support 14 in position on the turret table 12 when it is at its default lowered position. At the bottom of each package support 14 is a key 26 which matches and is engagable by the slot 28 on the movable insert 24.

Figure 5:
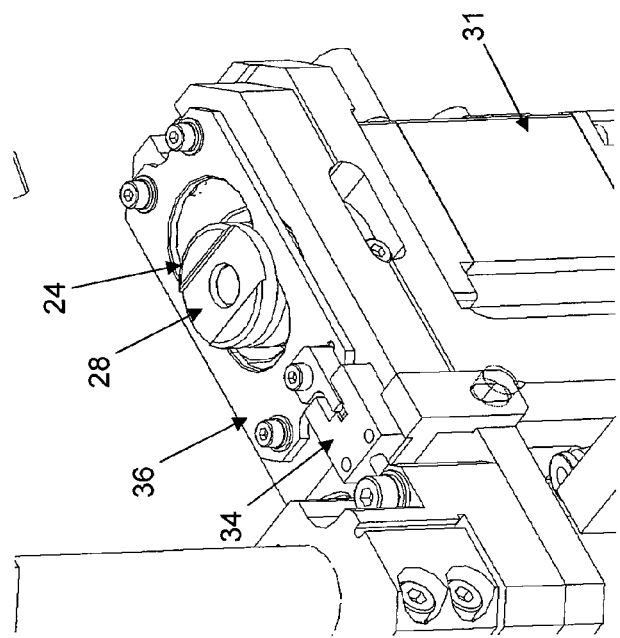
FIG. 5 is an isometric view of a movable insert which is actuable for coupling with an adjacent package support.

FIG. 5 is an isometric view of the movable insert 24 which is actuable for coupling with an adjacent package support 14. The slot 28 is located on the upper surface of the movable insert 24 for engaging the key 26 on the bottom surface of the package support 14 when the movable insert 24 is pushed up by the pneumatic cylinder 32. A sensor 34 detects an extent of movement of a bridge 36 next to the movable insert 24 which connects the sensor 34 to the movable insert 24. The sensor 34 helps to regulate the vertical displacement of the movable insert 24.

It should be appreciated that the orientation correction module 20 of the preferred embodiment of this invention is an efficient means of correcting the orientation of electronic devices. Having orientation correction conducted at a station along the traveling path of the package supports 14 allows a reduced number of indexing motions and unit contacts. This improves the accuracy of orienting electronic devices and increases throughput of the test handler accordingly. The self-locking means also allow the orientation of the package supports 14 and LEDs 11 to be fixed or changed conveniently. Furthermore, since the package support 14 is detachable from the turret table 12, it is convenient to change package supports 14 of various dimensions for engaging LEDs of different sizes.

The invention described herein is susceptible to variations, modifications and/or additions other than those specifically described and it is to be understood that the invention includes all such variations, modifications and/or additions which fall within the spirit and scope of the above description.

The invention claimed is:

1. A test handler comprising:
a package support for holding an electronic device in a certain orientation and for transporting the electronic device to a testing station for testing the electronic device, wherein the package support comprises a key for engagement, the key being operatively coupled to the electronic device for rotation together with the key; and
an orientation correction device separable from the package support, the orientation correction device being actuable to move along an axis of the package support to the package support and the orientation correction device comprising a slot that engages with the key of the package support to move the package support between a first position, wherein the package support is locked in position, and a second position, wherein the package support is rotatable about the axis of the package support so as to change the orientation of the electronic device that is held by the package support.

2. The test handler as claimed in claim 1, further comprising a conveyance mechanism on which multiple package supports are mounted for holding and transporting multiple electronic devices on the conveyance mechanism.

3. The test handler as claimed in claim 2, wherein the orientation correction device is located at a position along a traveling path on which the multiple package supports move on the conveyance mechanism.

4. The test handler as claimed in claim 2, wherein each package support is detachably mounted on the conveyance mechanism.

5. The test handler as claimed in claim 2, wherein the conveyance mechanism is a turret table.

6. The test handler as claimed in claim 1, further comprising an optical inspection device which is configured for visually inspecting the orientation of the electronic device at the position of the orientation correction device.

7. The test handler as claimed in claim 1, wherein the testing station for testing the electronic device is located downstream of the orientation correction device, and the test handler further comprises one or more output stations for the electronic devices which have been tested.

8. The test handler as claimed in claim 1, wherein the orientation correction device further comprises a locking mechanism connected to the key of the package support, the locking mechanism being slidable to move between the first position where the locking mechanism locks the orientation of the package support and the second position where the package support is unlocked to allow the package support to rotate.

9. The test handler as claimed in claim 8, including a motor operative to drive the orientation correction device in a linear direction to slide the locking mechanism from the first position to the second position so as to allow the package support to rotate.

10. The test handler as claimed in claim 9, further comprising a sensor coupled to the orientation correction device for sensing a linear displacement of the orientation correction device when it is moving in the linear direction.

11. A method of testing an electronic device, the method comprising the steps of:
holding the electronic device in a certain orientation by a package support and transporting the electronic device with the package support towards a testing station, wherein the package support comprises a key for engagement, the key being operatively coupled to the electronic device for rotation together with the key;
moving an orientation correction device along an axis of the package support to the package support so that a slot of the orientation correction device engages with the key of the package support to move the package support from a first position, wherein the package support is locked in position, to a second position, wherein the package support rotates with the orientation correction device about the axis of the package support so as to change the orientation of the electronic device that is held by the package support, the orientation correction device being separable from the package support; and thereafter
testing the electronic device at the testing station.

12. The method of testing an electronic device as claimed in claim 11, further comprising a conveyance mechanism on which multiple package supports are mounted for holding and transporting multiple electronic devices on the conveyance mechanism.

13. The method of testing an electronic device as claimed in claim 12, wherein the orientation correction device is located at a position along a traveling path on which the multiple package supports move on the conveyance mechanism.

14. The method of testing an electronic device as claimed in claim 12, wherein the conveyance mechanism is a turret table.

15. The method of testing an electronic device as claimed in claim 11, further comprising the step of visually inspecting the orientation of the electronic device at the position of the orientation correction device.

16. The method of testing an electronic device as claimed in claim 11, further comprising the step of sliding a locking mechanism connected to the key of the package support from the first position where the locking mechanism locks the orientation of the package support to the second position where the package support is unlocked before rotating the electronic device.

* * * * *